(12) United States Patent
Nag et al.

(10) Patent No.: US 6,313,010 B1
(45) Date of Patent: *Nov. 6, 2001

(54) INTEGRATED CIRCUIT INSULATOR AND METHOD

(75) Inventors: Somnath S. Nag; Amitava Chatterjee, both of Plano; Ih-Chin Chen, Richardson, all of TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/871,738

(22) Filed: Jun. 9, 1997

(51) Int. Cl.$^7$ .................................................. H01L 21/76
(52) U.S. Cl. ......................... 438/435; 438/424; 438/437; 148/DIG. 50
(58) Field of Search .................... 438/424, 427, 438/435, 437; 148/DIG. 50

(56) References Cited

U.S. PATENT DOCUMENTS

| 5,397,962 | * | 3/1995 | Moslehi | 315/111.51 |
|---|---|---|---|---|
| 5,441,094 | * | 8/1995 | Pasch | 438/424 |
| 5,712,205 | * | 1/1998 | Park et al. | 438/424 |
| 5,719,085 | * | 2/1998 | Moon et al. | 438/424 |
| 5,728,621 | * | 3/1998 | Zheng et al. | 438/427 |
| 5,736,462 | * | 4/1998 | Takahashi et al. | 438/424 |
| 5,851,899 | * | 12/1998 | Weigand | 438/427 |
| 5,915,190 | * | 6/1999 | Pirkle | 438/424 |

FOREIGN PATENT DOCUMENTS

| 0461 498 A2 | 6/1991 | (EP) . |
|---|---|---|
| 0637 065 A2 | 7/1994 | (EP) . |
| 0641 013 A2 | 7/1994 | (EP) . |

OTHER PUBLICATIONS

Dishing Effects in a Chemical Mechanical Polishing Planarization Process for Advanced Trench Isolation; C. Yu et al.; Appl. Phys. Lett., vol. 61, No. 11, Sep. 14, 1992; pp. 1344–1346.

* cited by examiner

*Primary Examiner*—Trung Dang
(74) *Attorney, Agent, or Firm*—Carlton H. Hoel; W. James Brady; Frederick J. Telecky, Jr.

(57) ABSTRACT

A trench isolation structure including high density plasma enchanced silicon dioxide trench filling (122) with chemical mechanical polishing removal of non-trench oxide.

4 Claims, 4 Drawing Sheets

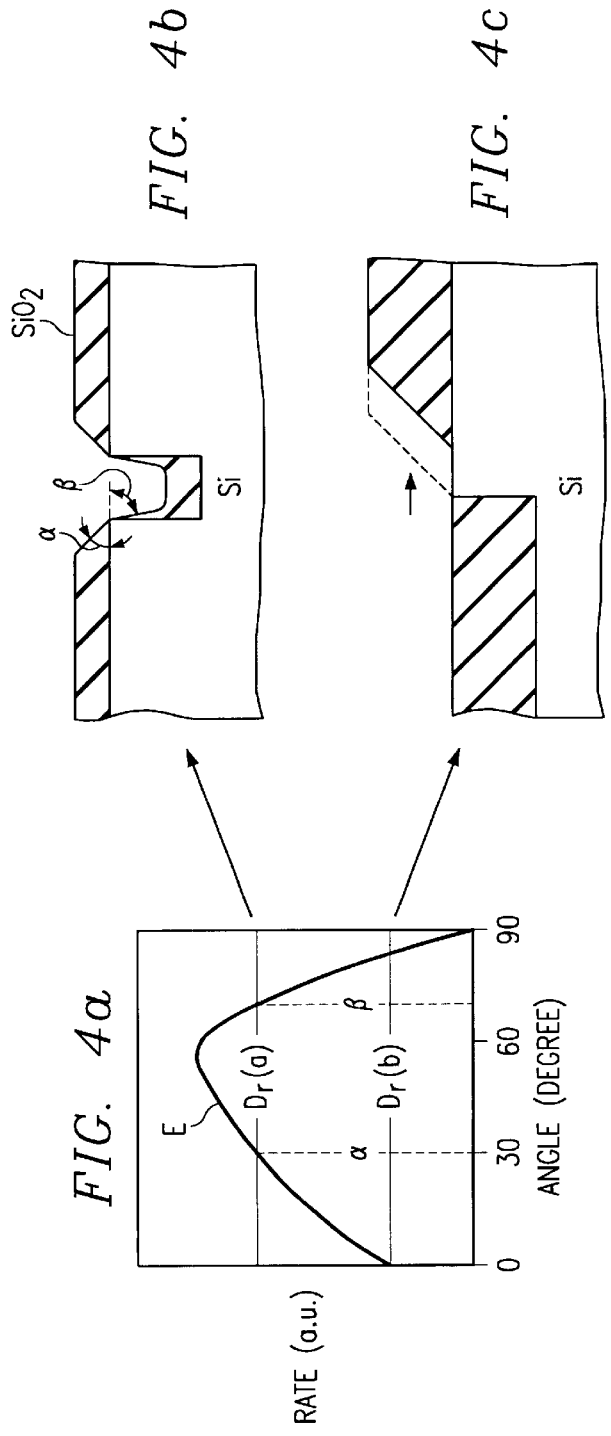
FIG. 4a
FIG. 4b
FIG. 4c
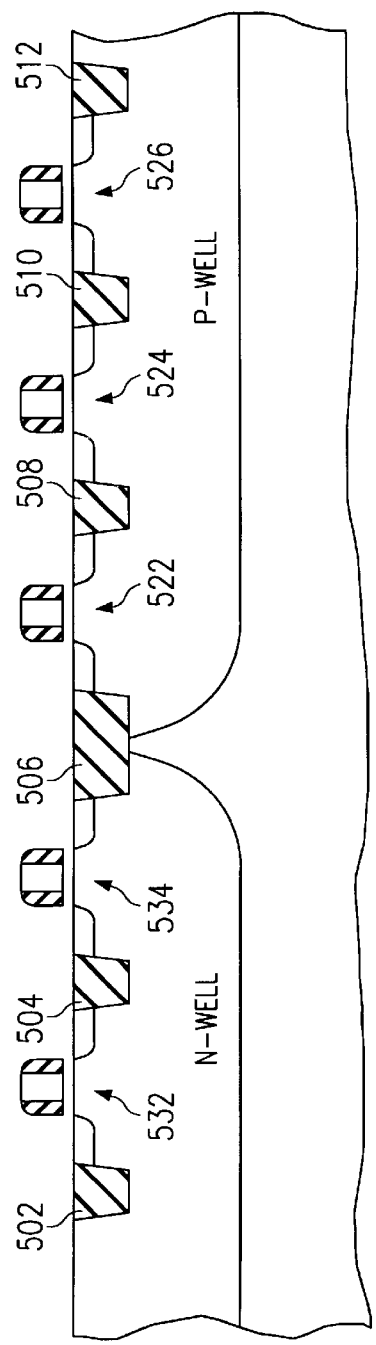
FIG. 5

INTEGRATED CIRCUIT INSULATOR AND METHOD

BACKGROUND OF THE INVENTION

The invention relates to semiconductor devices, and, more particularly, to integrated circuit insulation and methods of fabrication.

Integrated circuits typically include field effect transistors with source/drains formed in a silicon substrate and with insulated gates on the substrate plus multiple overlying metal (or polysilicon) wiring levels with an insulating layer between the gates/sources/drains and the first metal level wiring and between successive metal level wirings. Vertical vias in the insulating layers filled with metal (or polysilicon) provide connections between adjacent metal level wirings and between the gate/source/drain and the first metal level wiring. Further, the transistors are isolated from one another on the substrate by insulation areas formed by oxidation. This local oxidation of the silicon (LOCOS) substrate for device isolation has problems including the "bird's beak" lateral encroachment into device areas by the isolating oxide during its growth. This lateral encroachment occupies intolerably large fractions of the available silicon substrate area as the transistor size decreases.

Shallow trench isolation for integrated circuits with linewidths of 0.25–0.35 $\mu$m has been proposed as a solution to the bird's beak encroachment problem of LOCOS isolation. In particular, Gosho et al, Trench Isolation Technology for 0.35 $\mu$m Devices by Bias ECR CVD, 1991 VLSI Symp Tech Digest 87, describes a process which first etches trenches in a substrate and then fills the trenches with oxide by electron cyclotron resonance (ECR) plasma enhanced oxide deposition. The deposition uses a gas mixture of silane ($SiH_4$) and nitrous oxide ($N_2O$) and begins with the silane to nitrous oxide ratio set to deposit oxide faster than it is sputtered off for surfaces tilted less than 30 or more than 60 degrees from the direction of ion bombardment from the plasma. Once the trenches are filled (and large areas between the trenches have accumulated thick oxide deposits), then the silane to nitrous oxide ratio is adjusted to deposit oxide faster than it is sputtered off for surfaces tilted about 0 or more than 80 degrees from the direction of ion bombardment. This second step of plasma deposition basically contracts the oxide deposits on the areas between the trenches. The photolithographically mask off the trenches and closely adjacent areas; this exposes the oxide deposits on the areas between the trenches. Lastly, strip these exposed oxide deposits to leave oxide filled trenches. See FIGS. 3a–f illustrating this process and FIG. 4 showing the sputter etch rate and deposition rate depending upon surface tilt for two different gas mixtures.

Alternative trench isolation schemes include filling the trenches with spin on glasses such as hydrogen silsesquioxane (HSQ) or chemical vapor deposition using ozone plus tetrathoxysilane (TEOS).

These approaches have problems including thermal annealing for the HSQ and TESO and complex planarization and possible ECR damage to trench edges.

SUMMARY OF THE INVENTION

The present invention provides a trench isolation scheme using an inductively coupled high density plasma enhanced deposition of oxide for trench filling along with chemical mechanical polishing of the deposited oxide using part of the trench etch mask as the polish stopping layer.

This deposition method has the advantages including simple processing and avoidance of plasma ion bombardment damage.

BRIEF DESCRIPTION OF THE DRAWINGS

The drawings are schematic for clarity.

FIG. 4 shows deposition and sputter rates.

FIG. 5 illustrates in cross sectional elevation view preferred embodiment isolation in a CMOS structure.

DESCRIPTION OF THE PREFERRED EMBODIMENTS

First preferred embodiment trench isolation

Figure 1A:
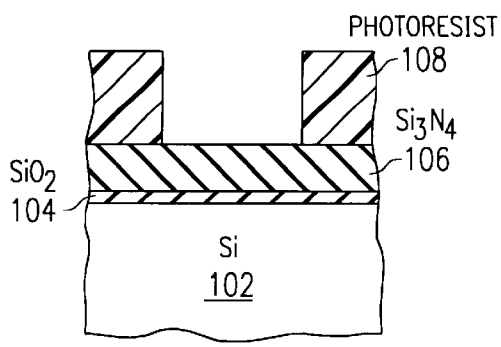
FIGS. 1a–f show in cross-sectional elevation views a first preferred embodiment trench isolation method.
Figure 1D:
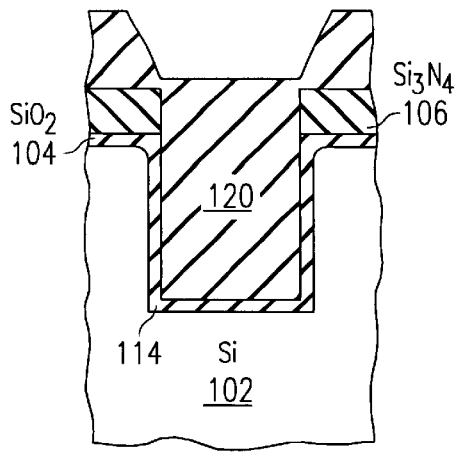

FIGS. 1a–f illustrate in cross-sectional elevation views steps of the first preferred embodiment method of forming a trench isolation structure. for clarity of explanation, the Figures only show a single trench and do not show any doped wells or epilayers in the silicon substrate. Indeed, FIG. 1a shows silicon substrate 102 with overlying 10 nm thick pad silicon dioxide layer 104, 200 nm thick silicon nitride layer 106, and patterned photoresist 108. Pad oxide 104 may be deposited or thermally grown, and nitride 106 may be desposited. Photoresist 108 would be about 1 $\mu$m thick and patterned to expose the portions of silicon substrate to be etched to form the isolation trenches. The trenches may be 0.3 $\mu$m wide.

Figure 1B:
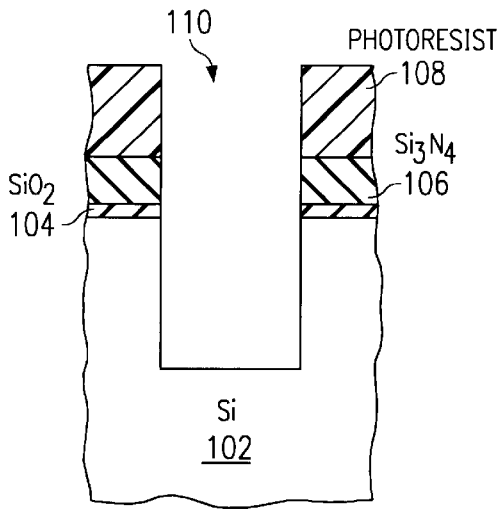

FIG. 1b illustrates the results of plasma etching with a chlorine based chemistry of the structure of FIG. 1a. The trench etched into silicon substrate 102 may be 0.5 $\mu$m deep and have a sidewall slope of 75 degrees. Thus trench 110 may have an aspect ratio of roughly 2:1. Avoid channel stop implants into the trench sidewalls because these will reduce the adjacent active device areas.

Figure 1E:
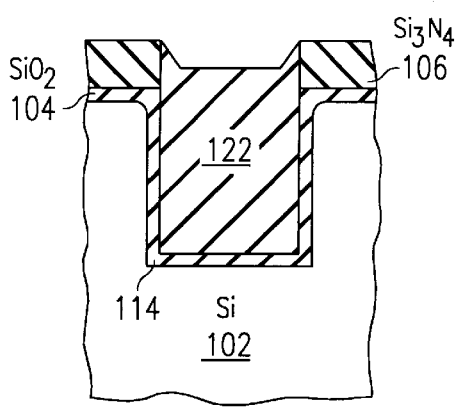
Figure 1C:
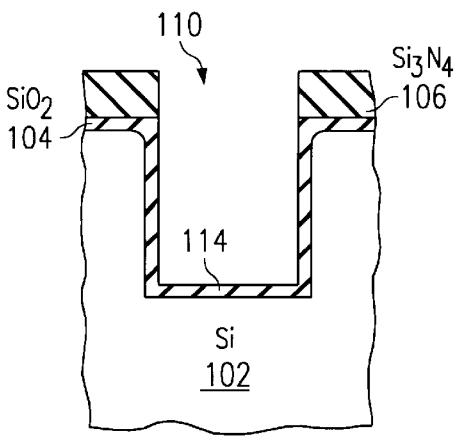

FIG. 1c shows stripping of photoresist 108 followed by a 20 nm thick thermal oxidation 114 of trench 110 sidewalls and bottom. The oxidation may be at 90° C. with a 5% HCl atmosphere. This oxidation also rounds trench 110 corners at the substrate surface, but nitride 106 prevents further oxidation. Pad oxide 104 and nitride 106 will form a polish stopping layer for later chemical mechanical polishing of the insulating material used to fill trenches 110. Pad oxide 104, nitride 106, and thermal oxide 114 form a continuous coating of silicon substrate 102 and protects against plasma ion bombardment in trench 110 filling step.

Figure 2:
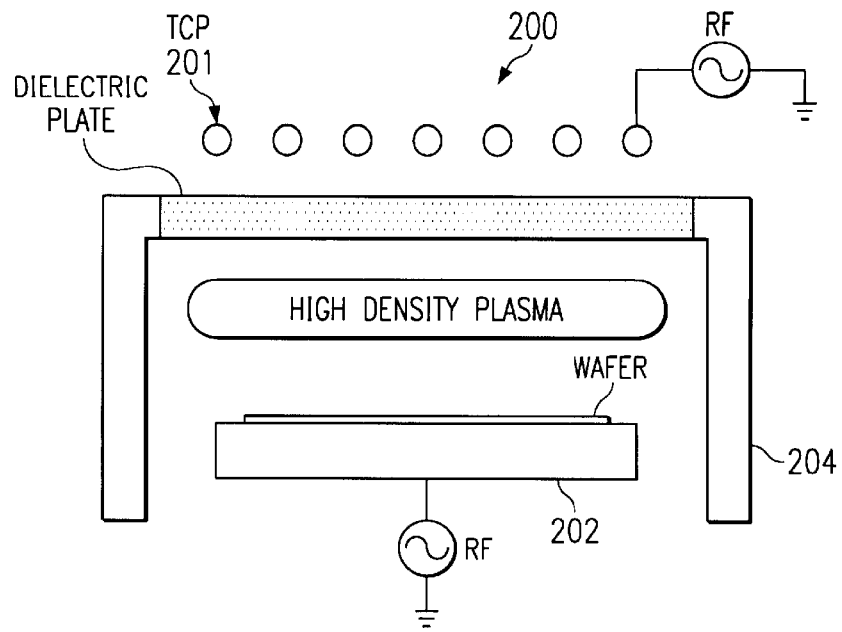
FIG. 2 shows a high density plasma reactor.
Figure 3A:
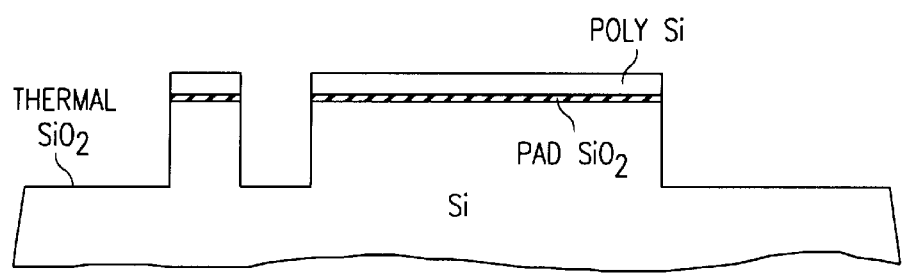
FIGS. 3a–f illustrate in cross-sectional elevation views a prior art trench isolation method.
Figure 3B:
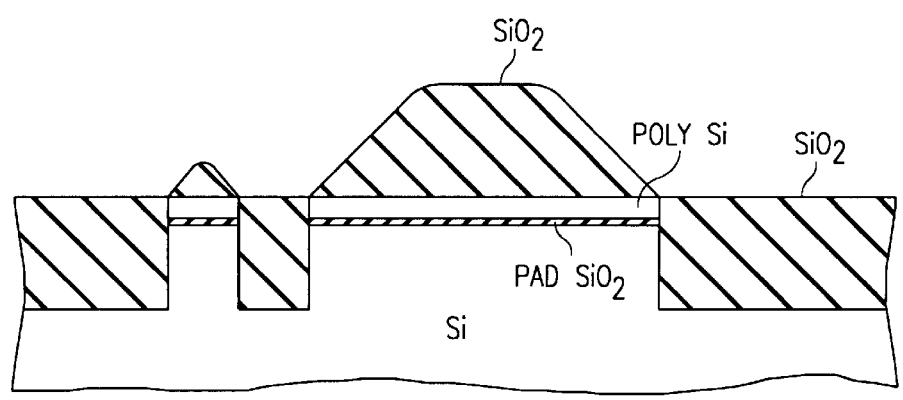
Figure 3C:
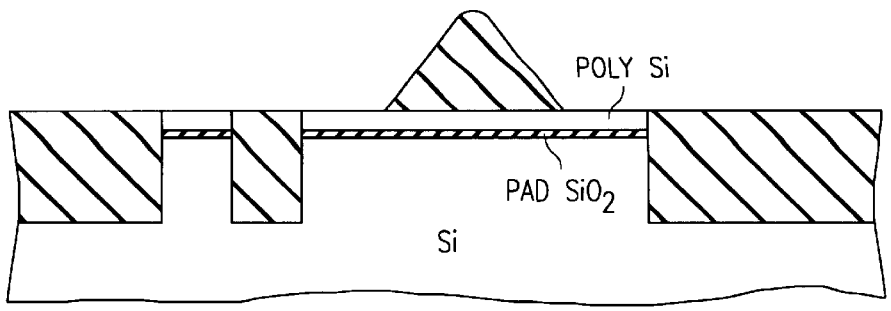
Figure 3D:
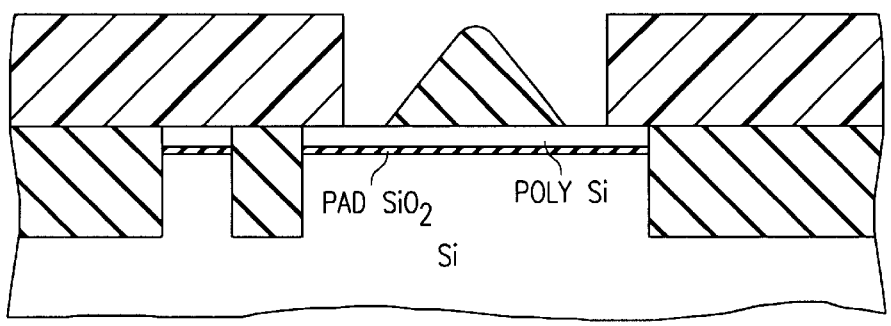
Figure 3E:
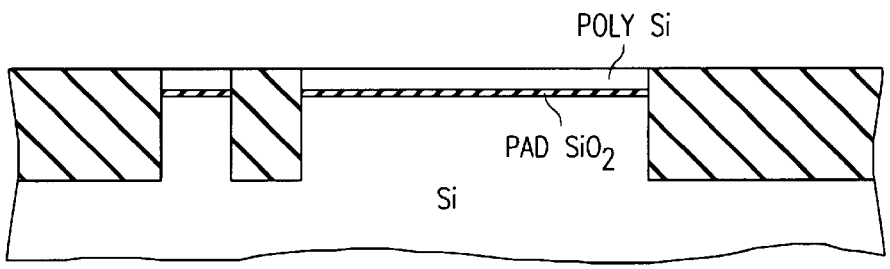
Figure 3F:
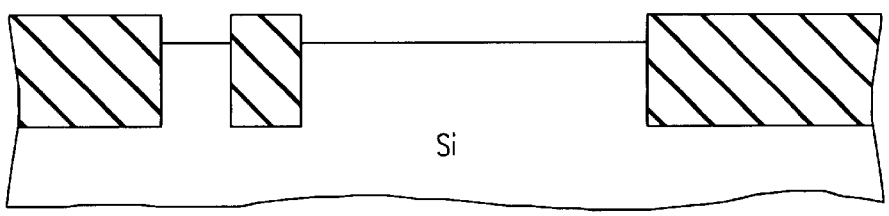

Next, insert the trenched substrate into inductively coupled high-density plasma reactor 200, such as illustrated in FIG. 2. Then deposit 0.9 $\mu$m of oxide 120 by plasma-enhanced deposition using source gasses silane, oxygen, and argon diluent; see FIG. 1d. Plasma heating increases the substrate temperature which is held by cooling at about 330° C. The source gas flows are about 30 sccm $SiH_4$, 40 sccm $O_2$, and 20 sccm Ar. The total pressure in the reaction chamber is about 4 mTorr; but despite the low pressure, the ion density is about $10^{13}/cm^3$ for reactor 200 and the oxide deposits at about 300 nm/min. Indeed, the deposited oxide has high quality and does not need a high temperature densification or cure anneal.

The high ion density derives from the inductive coupling of rf source 201 with the feed gasses rather than the traditional capacitive coupling or ECR coupling. The inductive coupling in reactor 200 allows adjustment of the bias rf capacitive voltage (which determines plasma potential for ion bombardment of the substate) between the plasma and the substrate on chuck 202 without affecting the plasma density. Set the bias about 1250 volts; this yields a deposition to sputter ratio of about 3.4 (for surfaces tilted 0 degrees from the ion bombardment direction). This insures filling trenches 110 without removal of oxide 104–114 and exposure of silicon substrate 102 along trench 110 sidwall tops to plasma ion bombardment; this limits leakage along trench 110 sidealls.

An alternative does not grow oxide 114 but rather begins trench 110 filling deposition with no bias to yield a conformal layer (no sputtering) of oxide without damage to silicon substrate 102 and then ramps up the bias voltage to insure trench 110 filling by oxide 120. In effect, the initial zero or low bias plasma enhanced deposition of oxide to a thickness of 20 nm provides the protective liner for trench sidewalls and the subsequent higher bias deposition fills the remainder of trench 110.

Modifying the source gas flow rates and total pressure can change the deposition rate and the oxide quality.

Then remove the portion of oxide 120 outside of trenches 110 by applying chemical-mechanical polishing (CMP) using nitride 106 as a polish stopping layer; see FIG. 1e showing oxide 122 remaining in trenches 110.

Figure 1F:
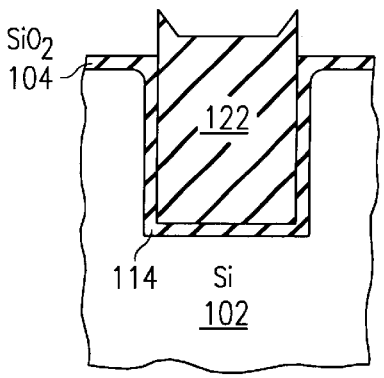

Lastly, strip nitride 106 with phosphoric acid or a selective plasma etch. FIG. 1f shows the final isolation structure. Subsequent processing will form transistors and other devices, insulating layers, and interconnection wirings to complete an integrated circuit.

FIG. 2 shows reactor 200 in schematic cross sectional elevation view as including high density plasma (HDP) source 201 powered by an RF generator with a maximum of 3500 watts output, movable chuck 202 for holding wafers, and chamber 204. Chuck 202 has a helium backside gas feed for wafer temperature stability during processing and is powered by a capacitive RF generator with a maximum of 2000 watts output. Chuck 202 can hold a single 8 inch diameter wafer. Control of the RF power to HDP source 201 controls the plasma density, and control of the RF power to chuck 202 controls the bias developed between the plasma and the wafer and thus controls the ion energy for ions bombarding the wafer. The RF power to chuck 202 is small for the low bias deposition initial portion of the first preferred embodiment method and increases for the high bias deposition final portion.

Integrated circuit

FIG. 5 shows the first preferred embodiment trench isolation structure 502–512 for a twin-well CMOS integrated circuit with NMOS transistors 522–526 and PMOS transistors 532–534. Overlying insulation and interconnection layers have been omitted from FIG. 5 for clarity.

Modifications and advantages

The preferred embodiments may be varied in many ways while retaining one or more of the features of inductively coupled high density plasma oxide filled trenches and use of the nitride etch mask portion as a CMP polish stopping layer.

For example, the dimensions of the trenches could be varied, such as 0.25–0.35 $\mu$m minimum width and 0.35–0.7 $\mu$m depth with sidewall slopes 70–80 degrees; the layer thicknesses could be varied, such as pad oxide thickness in the range 7–15 nm, nitride thickness 150–250 nm, and so forth; the source gasses for the oxide deposition could be varied and include silane, dichlorosilane, ozone, nitrous oxide, and so forth; the bias during plasma deposition could be ramped up from a low bias and still insure trench filling.

What is claimed is:

1. A method of trench isolation fabrication, comprising the steps of:

(a) forming a polish stopping layer on a silicon substrate;

(b) patterning said polish stopping layer;

(c) forming trenches in said substrate where said substrate is exposed by said patterned stopping layer;

(d) growing a thin layer of an insulating material on the silicon exposed in said trenches;

(e) depositing with an adjacent inductively coupled high density plasma a thick layer of said insulating material on said substrate, said insulating material filling said trenches; and (f) chemical mechanically polishing said insulating material to said polish stopping layer.

2. The method of claim 1 wherein:

(a) said polish stopping layer is made of silicon nitride; and (b) said insulating material is silicon oxide.

3. A method of trench isolation fabrication, comprising the steps of:

(a) forming a polish stopping layer on a silicon substrate;

(b) patterning said polish stopping layer;

(c) forming trenches in said substrate where said substrate is exposed by said patterned stopping layer;

(d) depositing with a low-bias high-density plasma a thin layer of an insulating material on said polish stopping layer and on exposed silicon in said trenches;

(e) depositing with a high-bias high-density plasma a thick layer of said insulating material on said thin layer of insulating material, said insulating material filling said trenches; and (f) chemical mechanically polishing said insulating material to said polish stopping layer.

4. The method of claim 3 wherein:

(c) said polish stopping layer is made of silicon nitride; and (d) said insulating material is silicon oxide.

* * * * *

UNITED STATES PATENT AND TRADEMARK OFFICE
CERTIFICATE OF CORRECTION

| | |
|---|---|
| PATENT NO. | : 6,313,010 B1 |
| APPLICATION NO. | : 08/871738 |
| DATED | : November 6, 2001 |
| INVENTOR(S) | : Somnath S. Nag, Amitava Chatterjee and Ih-Chin Chen |

It is certified that error appears in the above-identified patent and that said Letters Patent is hereby corrected as shown below:

On the title page

On the left column of the cover page, after "(22) Filed: June 9, 1997", insert the following:

--Related U.S. Application Data--
-- (60) Provisional application No. 60/019,688, filed 06/10/1996--

In column 1, after line 2, insert the following paragraph:

--This application claims priority under 35 USC § 119(e) (1) of provisional application number 60/019,688, filed 06/10/96.--

Signed and Sealed this

Tenth Day of April, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,313,010 B1 | Page 1 of 1 |
| APPLICATION NO. | : 08/871738 | |
| DATED | : November 6, 2001 | |
| INVENTOR(S) | : Somnath S. Nag, Amitava Chatterjee and Ih-Chin Chen | |

It is certified that error appears in the above-identified patent and that said Letters Patent is hereby corrected as shown below:

In column 4, after line 52, insert the following:

--5. The method of claim 1, wherein:

(a) the plasma bias of said high-density plasma ramps up from a low bias during said depositing of step (e) of claim 1.--

Signed and Sealed this

Twenty-fourth Day of February, 2009

JOHN DOLL
*Acting Director of the United States Patent and Trademark Office*